(12) United States Patent
Sharon et al.

(10) Patent No.: US 11,860,733 B2
(45) Date of Patent: Jan. 2, 2024

(54) MEMORY MATCHED LOW DENSITY PARITY CHECK CODING SCHEMES

(71) Applicant: Western Digital Technologies, Inc., San Jose, CA (US)

(72) Inventors: Eran Sharon, Rishon Lezion (IL); Ran Zamir, Ramat Gan (IL); David Avraham, Even Yehuda (IL); Idan Alrod, Herzeliya (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/545,051

(22) Filed: Dec. 8, 2021

(65) Prior Publication Data
US 2023/0176947 A1 Jun. 8, 2023

(51) Int. Cl.
*G06F 11/10* (2006.01)
*G06F 11/07* (2006.01)
*H03M 13/11* (2006.01)

(52) U.S. Cl.
CPC ........ *G06F 11/1068* (2013.01); *G06F 11/076* (2013.01); *G06F 11/0772* (2013.01); *G06F 11/1048* (2013.01); *H03M 13/1114* (2013.01); *H03M 13/1125* (2013.01)

(58) Field of Classification Search
CPC ............. G06F 11/1048; G06F 11/1072; G06F 11/1044; G06F 11/1068; G06F 3/0619; G06F 11/1008; G06F 11/10; G06F 11/1012; G06F 11/076; G06F 11/0772; G11C 2029/0411; G11C 7/1006; G11C 29/52; G11C 29/42; H03M 13/1114; H03M 13/1125
See application file for complete search history.

(56) References Cited

U.S. PATENT DOCUMENTS

| | | | | |
|---|---|---|---|---|
| 5,450,363 A | * | 9/1995 | Christopherson | G11C 11/56 341/98 |
| 5,621,682 A | * | 4/1997 | Tanzawa | G11C 11/56 714/766 |
| 8,127,091 B2 | * | 2/2012 | Sarin | G11C 11/5628 365/185.24 |

(Continued)

FOREIGN PATENT DOCUMENTS

JP 2013-141219 A 7/2013

OTHER PUBLICATIONS

Japanese Patent Office Notice of Reasons for Refusal for application 2022-083498 dated Jul. 18, 2023 (6 pages with machine translation).

*Primary Examiner* — Steve N Nguyen
(74) *Attorney, Agent, or Firm* — Michael Best & Friedrich LLP

(57) ABSTRACT

Low-density parity-check (LDPC) coding based on memory cell voltage distribution (CVD) in data storage devices. In one embodiment, a memory controller includes a memory interface configured to interface with a non-volatile memory; and a controller. The controller is configured to receive a plurality of data pages to be stored in the non-volatile memory, and transform the plurality of data pages into a plurality of transformed data pages. The controller is further configured to determine a plurality of parity bits based on the plurality of transformed data pages, and store the plurality of data pages and the plurality of parity bits in the non-volatile memory.

20 Claims, 8 Drawing Sheets

(56) References Cited

U.S. PATENT DOCUMENTS

| | | | |
|---|---|---|---|
| 8,656,257 B1 * | 2/2014 | Micheloni | G06F 11/108 |
| | | | 714/764 |
| 9,653,157 B1 * | 5/2017 | Kim | G11C 16/0483 |
| 10,802,909 B2 * | 10/2020 | Fackenthal | H03M 13/37 |
| 2002/0035710 A1 * | 3/2002 | Miura | G11C 11/5628 |
| | | | 714/716 |
| 2008/0028274 A1 * | 1/2008 | Lin | H03M 13/1108 |
| | | | 714/752 |
| 2008/0244338 A1 * | 10/2008 | Mokhlesi | G06F 11/1068 |
| | | | 714/702 |
| 2009/0177931 A1 * | 7/2009 | Song | G06F 11/141 |
| | | | 714/E11.005 |
| 2013/0031431 A1 * | 1/2013 | Sharon | G11C 16/3481 |
| | | | 714/719 |
| 2015/0178191 A1 * | 6/2015 | Camp | G06F 12/0246 |
| | | | 711/103 |
| 2015/0220390 A1 | 8/2015 | Liu et al. | |
| 2020/0042223 A1 * | 2/2020 | Li | G06F 11/1072 |

* cited by examiner

MEMORY MATCHED LOW DENSITY PARITY CHECK CODING SCHEMES

BACKGROUND

This application relates generally to data storage devices and, more particularly, to low-density parity-check (LDPC) coding based on memory cell voltage distribution (CVD) in data storage devices.

Memory devices are increasingly experiencing higher memory capacities with an increase in memory density through process scaling, 3D stacking, and storage of more bits per memory cell. The increase in memory density results in a fundamentally "noisier" media. Error correction code (ECC) is also allocated space in the memory, reducing the amount of space for actual user data.

SUMMARY

The techniques of the present disclosure optimize coding of ECC to operate close to the theoretical limit (i.e., the Shannon limit). Specifically, coding schemes of the present disclosure account for the expected error rate of various programming states when performing LDPC coding. As described in greater detail below, coding schemes of the present disclosure reduce memory overprovisioning, including the space allocated for ECC.

Advanced coding schemes, such as LDPC, are typically not tailored based on the memory error model for memory devices. Specifically, the memory error protection level is not adjusted for each memory read threshold, and is instead determined globally. The memory error model is typically only used for setting decoder initialization values. The techniques of the present disclosure propose using the memory error model during ECC construction and design.

The disclosure provides a memory controller including, in one embodiment, a memory interface and a controller. The memory interface is configured to interface with a non-volatile memory. The controller is configured to receive a plurality of data pages to be stored in the non-volatile memory and transform the plurality of data pages into a plurality of transformed data pages. The controller is further configured to determine a plurality of parity bits based on the plurality of transformed data pages, and store the plurality of data pages and the plurality of parity bits in the non-volatile memory.

The disclosure also provides a method. In one embodiment, the method includes receiving a plurality of data pages to be stored in a non-volatile memory and transforming the plurality of data pages into a plurality of transformed data pages. The method further includes determining a plurality of parity bits based on the plurality of transformed data pages and storing the plurality of data pages and the plurality of parity bits in the non-volatile memory.

The disclosure also provides an apparatus. The apparatus includes a means for interfacing with a non-volatile memory. The apparatus includes a means for receiving a plurality of data pages to be stored in the non-volatile memory and a means for transforming the plurality of data pages into a plurality of transformed data pages. The apparatus further includes a means for determining a plurality of parity bits based on the plurality of transformed data pages and a means for storing the plurality of data pages and the plurality of parity bits in the non-volatile memory.

In this manner, various aspects of the disclosure provide for improvements in at least the technical fields of data storage devices and their design and architecture. The disclosure can be embodied in various forms, including hardware or circuits controlled by firmware (i.e., code executing on a processor), and computer systems and networks; as well as hardware-implemented methods, signal processing circuits, memory arrays, application specific integrated circuits, field programmable gate arrays, and the like. The foregoing summary is intended solely to give a general idea of various aspects of the disclosure, and does not limit the scope of the disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the memory device may be performed by hardware (e.g., analog or digital circuits), a combination of hardware and software (e.g., program code or firmware, stored in a non-transitory computer-readable medium, that is executed by processing or control circuitry), or any other suitable means. The following description is intended solely to give a general idea of various aspects of the disclosure, and does not limit the scope of the disclosure in any way.

Figure 1:
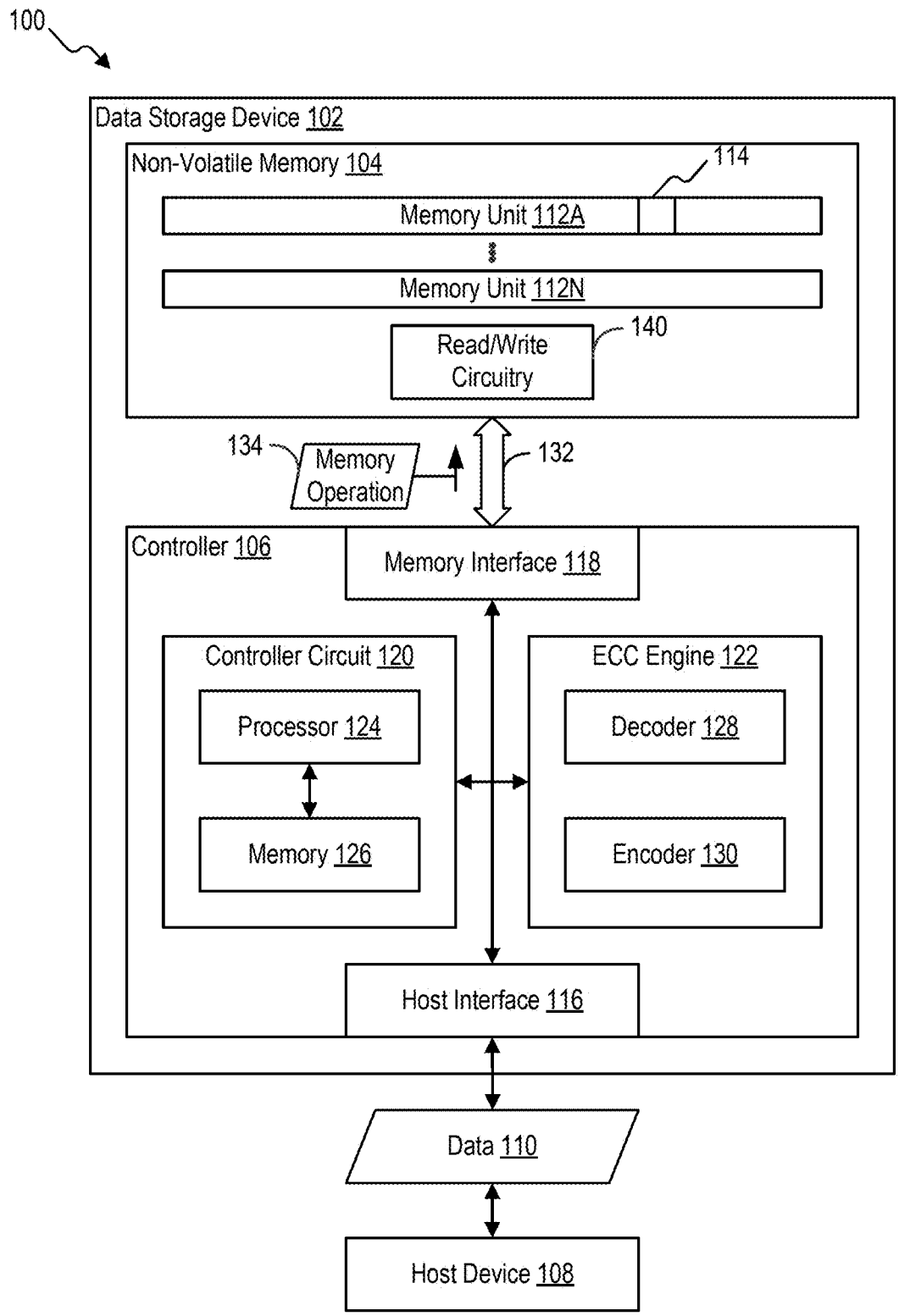
FIG. 1 is block diagram of a system including a data storage device with memory matched LDPC coding/decoding, in accordance with some embodiments of the disclosure.

FIG. 1 is a block diagram of one example of a system 100 that includes a data storage device 102. In some implementations, the data storage device 102 is a flash memory device. For example, the data storage device 102 is a Secure Digital SD® card, a microSD® card, or another similar type of data storage device. The data storage device 102 illustrated in FIG. 1 includes a non-volatile memory 104 and a controller 106. The data storage device 102 is coupled to a host device 108. The host device 108 is configured to provide data 110 (for example, user data) to the data storage device 102 to be stored, for example, in the non-volatile memory 104. The host device 108 is, for example, a smart phone, a music player, a video player, a gaming console, an e-book reader, a personal digital assistance device, a tablet, a notebook computer, or another similar device.

The non-volatile memory 104 of the data storage device 102 is coupled to the controller 106. In some implementations, the non-volatile memory 104 is NAND flash memory. The non-volatile memory 104 illustrated in FIG. 1 includes a plurality of memory units 112A-112N (for example, flash memory units). Each of the plurality of memory units 112A-112N includes a plurality of storage elements. For example, in FIG. 1, the memory unit 112A includes a representative storage element 114. In some implementations, the storage element 114 is a multi-level cell flash memory, such as a 2 levels cell ("SLC"), a 4 levels cell ("MLC"), an 8 levels cell ("TLC"), a 16 levels cell ("QLC"), or a flash memory cell having a larger number of bits per cell (for example, between five and ten bits per cell). In some implementations, the plurality of memory units 112A-112N are included in a word line or page of a multi-level cell flash memory. In other implementations, the plurality of memory units 112A-112N are spread across multiple word lines or pages of a multi-level cell flash memory.

The controller 106 illustrated in FIG. 1 includes a host interface 116, a memory interface 118, a controller circuit 120, and an ECC engine 122. The controller 106 is illustrated in FIG. 1 in a simplified form. One skilled in the art would recognize that a controller for a non-volatile memory would include additional modules or components other than those specifically illustrated in FIG. 1. Additionally, although the data storage device 102 is illustrated in FIG. 1 as including the controller 106 and modules for performing, for example, ECC, in other implementations, the controller 106 is instead located within the host device 108 or is otherwise separate from the data storage device 102. As a result, ECC and other flash translation layer ("FTL") operations that would normally be performed by the controller 106 (for example, wear leveling, bad block management, data scrambling, garbage collection, address mapping, etc.) can be performed by the host device 108 or another device that connects to the data storage device 102.

The controller 106 is configured to send data to, and receive data and instructions from, the host device 108 via the host interface 116. The host interface 116 enables the host device 108 to, for example, read from the non-volatile memory 104 and to write to the non-volatile memory 104 using any suitable communication protocol. Suitable communication protocols include, for example, the Universal Flash Storage ("UFS") Host Controller Interface specification, the Secure Digital ("SD") Host Controller specification, etc.

The controller 106 is also configured to send data and commands to (e.g., the memory operation 134), and receive data from, the non-volatile memory 104 with the memory interface 118. As an illustrative example, the controller 106 is configured to send data and a write command to instruct the non-volatile memory 104 to store data in a particular memory location in the non-volatile memory 104. The controller 106 is also configured to send a read command to the non-volatile memory 104 to read data from a particular memory location in the non-volatile memory 104. In some examples, the controller 106 is coupled to the non-volatile memory 104 with a bus 132 in combination with the memory interface 118. The bus 132 may include multiple distinct channels to enable the controller 120 to communicate with each of the one or more memory units 112 in parallel with, and independently of, communication with the other memory dies 103.

The controller circuit 120 illustrated in FIG. 1 includes an processor 124 (for example, a microprocessor, a microcontroller, a field-programmable gate array ["FPGA"] semiconductor, an application specific integrated circuit ["ASIC"], or another suitable programmable device) and a non-transitory computer readable medium or memory 126 (for example, including random access memory ["RAM"] and read only memory ["ROM"]). The processor 124 is operatively connected to the various modules within the controller circuit 120, the controller 106, and the data storage device 102. For example, firmware is loaded in a ROM of the memory 126 as computer executable instructions. Those computer executable instructions are capable of being retrieved from the memory 126 and executed by the processor 124 to control the operation of the controller circuit 120 and perform the processes described herein (for example, data alignment and ECC). In some implementations, one or more modules of the controller circuit 120 correspond to separate hardware components within the controller circuit 120. In other implementations, one or more modules of the controller circuit 120 correspond to software stored within the memory 126 and executed by the processor 124. The memory 126 is configured to store data used by the controller circuit 120 during operation.

The ECC engine 122 is configured to receive data to be stored in the non-volatile memory 104. The ECC engine 122 is configured to encode data using an ECC encoding scheme. In some implementations, the ECC encoding scheme is a Reed Solomon encoding scheme, a Bose-Chaudhuri-Hocquenghem ("BCH") encoding scheme, a low-density parity check ("LDPC") encoding scheme, or another suitable encoding scheme. The ECC engine 122 illustrated in FIG. 1 includes a decoder 128 and an encoder 130. The decoder 128 is configured to decode data that is read from the non-volatile memory 104. For example, the decoder 128 is configured to decode a codeword read from the non-volatile memory 104. The codeword may include, for example, the 4*k data bits and the 4*m parity bits, described in greater detail below. The decoder 128 is configured to detect and correct bit errors that are present in the data read from the non-volatile memory 104. The decoder 128 corrects bit errors present in the data read from the non-volatile memory 104 up to an error correction capability of the implemented ECC scheme. In some implementations, the ECC engine 122 is included in the controller circuit 120.

Figure 2:
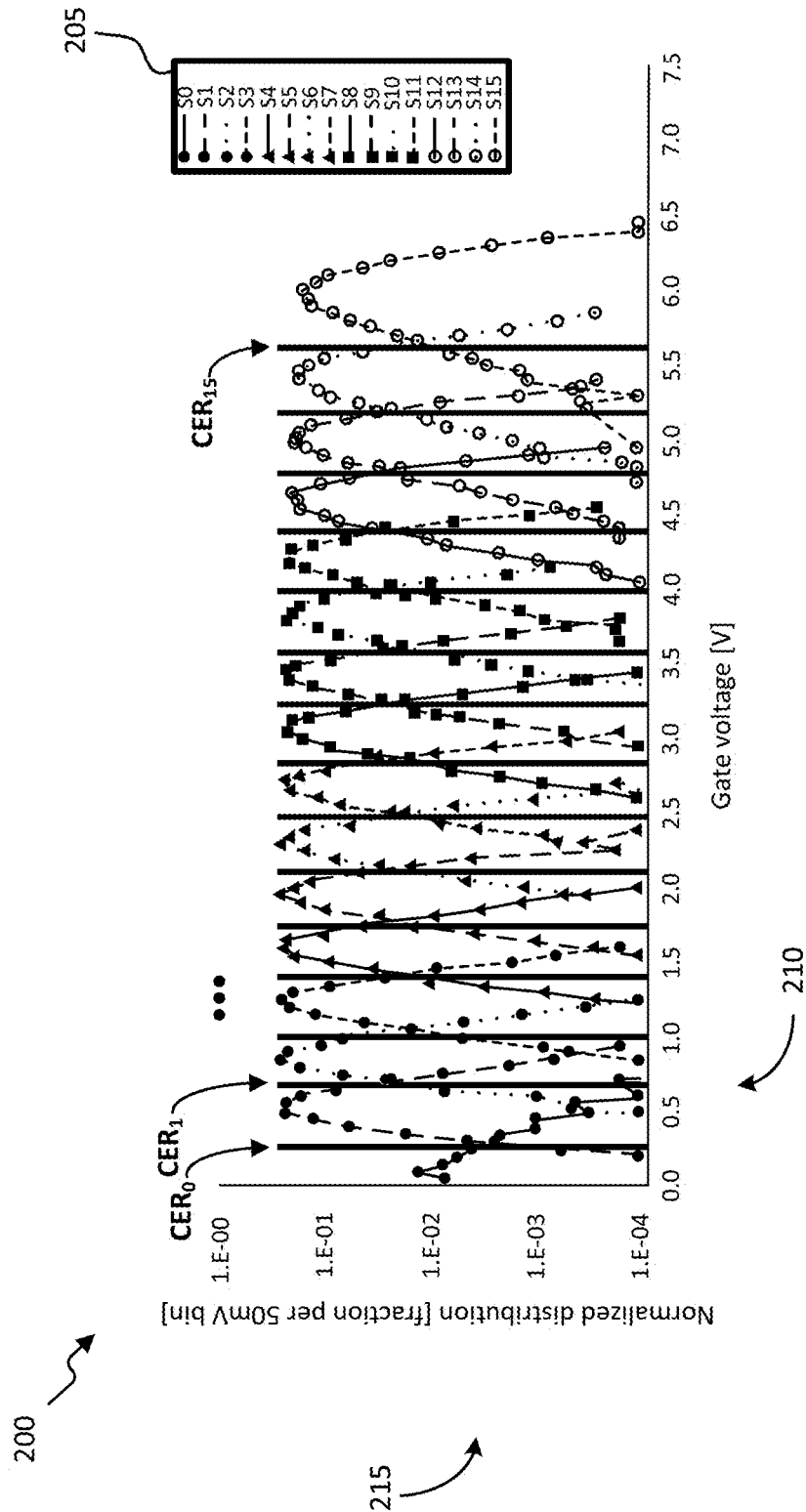
FIG. 2 is a graph illustrating the error rate for various cell voltage distribution levels of a quad-level cell memory, in accordance with some embodiments of the disclosure.

As previously stated, coding schemes descried herein use the expected error rate of each programming state induced by the cell voltage distribution (CVD) in a memory device. FIG. 2 illustrates a graph 200 an example CVD of a QLC memory. A plurality of memory cell states S0-S15 are shown by legend 205. The graph 200 includes an x-axis 210 representing the gate voltage values of the plurality of memory cell states S0-S15. The graph 200 includes a y-axis 215 representing the bit distribution for each of the plurality of memory cell states S0-S15. In some implementations, one or more of the memory cell states S0-S15 may overlap another one or the memory cell states S0-S15 at a given gate voltage. Such an overlap results in a cell error rate (CER) for each overlap. Graph 200 includes fifteen CERs for the fifteen overlaps between the sixteen memory cell states S0-S15. Additionally, each memory cell state S0-S15 in graph 200 are not symmetrical, and may have a different range of gate voltage or bit distribution. In some ideal implementations, each memory cell state S0-S15 are identical.

Figures 3A, 3B:
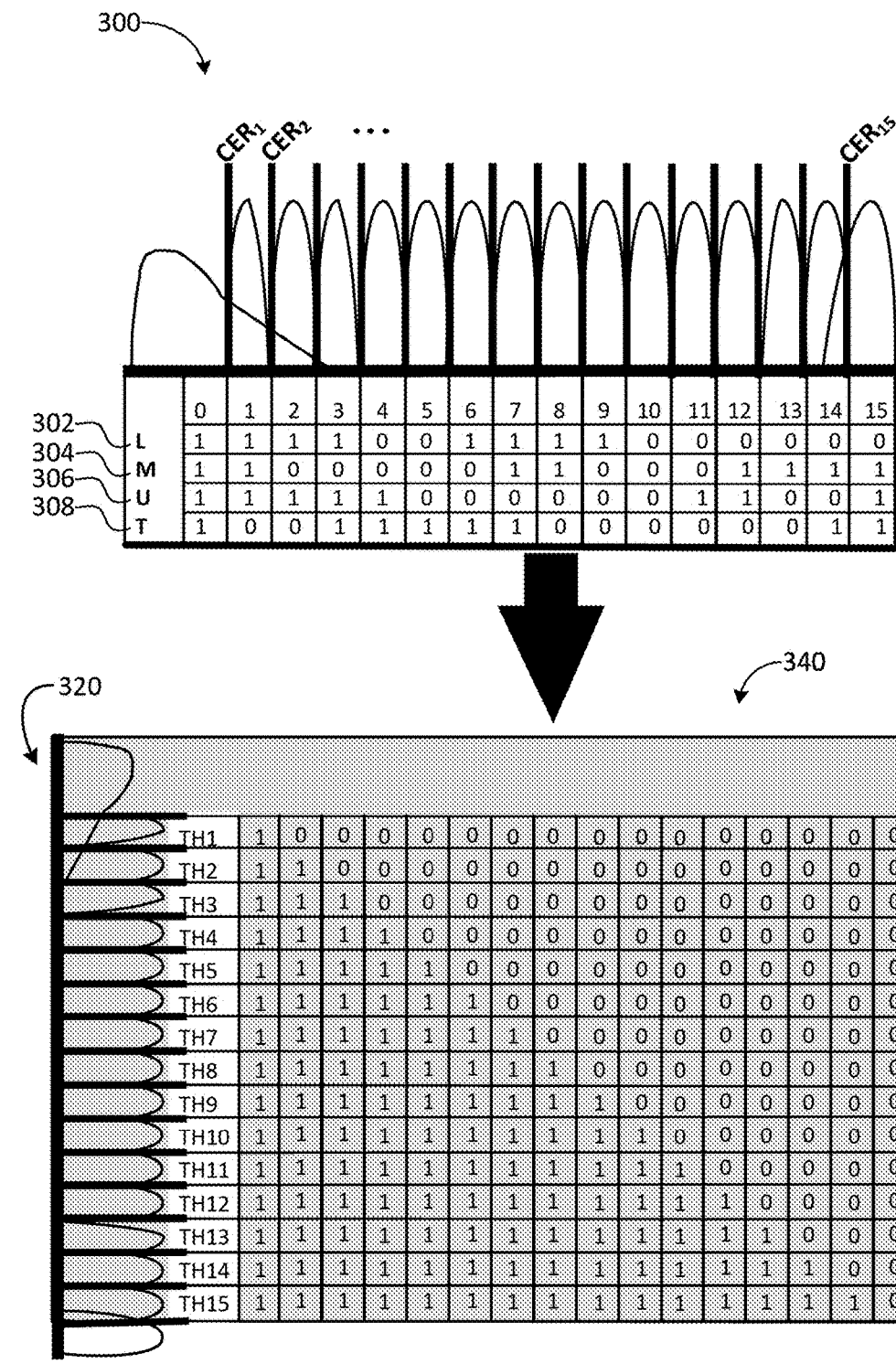
FIGS. 3A-3B is an example of a memory matching transform for a quad-level cell (QLC) memory, in accordance with some embodiments of the disclosure.

To tailor LDPC to match the CVD and its memory error model (defined by the CERs), what is herein referred to as a "memory matching transform" (i.e., a $m^2$ transform) is applied to the memory model, ensuring that the errors that are introduced by each read threshold affect only a subset of the coded bits. FIGS. 3A-3B illustrate an example memory matching transform for a QLC memory. As illustrated in FIG. 3A, the QLC memory has a plurality of memory cell states 300, where each memory cell state 300 stores n=4 user data bits in each memory cell state 300, with a total of $2^n$=16 states (beginning with state 0 and ending with state 15). Each memory cell state 300 has a lower page 302, a middle page 304, an upper page 306, and a top page 308, each page configured to store a bit. In the example of FIG. 3A, only one bit is changed when moving from left to right through the states. For example, state 0 stores the bits [1 1 1 1], while state 1 stores the bits [1 1 1 0] in which only the bit in the top page 308 has changed. State 2 stores the bits [1 0 1 0] in which only the bit in the middle page 306 has changed.

To read each memory cell state 300, $t=2^n-1=15$ read thresholds (i.e., the CERs) are required. Hence, the memory matching transform converts every n=4 user data pages into t=15 transformed data pages 320. The transform from FIG. 3A to FIG. 3B occurs vertically. For example, while state 0 stores the bits [1 1 1 1], the transformed page 0 stores the bits [1 1 1 1 1 1 1 1 1 1 1 1 1 1 1]. State 1 stores the bits [1 1 1 0], while transformed page 1 stores the bits [0 1 1 1 1 1 1 1 1 1 1 1 1 1 1]. With the transformed data pages 320, any cell error introduced by the j'th read threshold will introduce a bit error only at the j'th transformed page 320. Each transformed page has a CER value 340.

For example, consider a cell programmed to the first of the plurality of memory cell states 300 (i.e., state 0) such that the values of the transformed pages corresponding to this specific cell are [1 1 1 1 1 1 1 1 1 1 1 1 1 1 1]. However, during reading, a cell error is introduced by the $1^{st}$ read threshold, resulting in reading the cell's state at a second plurality of cell states 200 (i.e., state 1) and thus the corresponding transformed page values read out are [0 1 1 1 1 1 1 1 1 1 1 1 1 1 1]. Hence, a bit error is only introduced in the $1^{st}$ page of the 15 transformed pages.

In another example, consider a cell programmed to the fourth of the plurality of memory cell states (i.e., state 3) such that the values of the transformed pages corresponding to this specific cell are [0 0 0 1 1 1 1 1 1 1 1 1 1 1 1]. However, during reading, a cell error is introduced by the $3^{rd}$ read threshold, resulting in reading the cell's state at a third plurality of cell states 200 (i.e., state 2) and thus the corresponding transformed page values read out are [0 0 1 1 1 1 1 1 1 1 1 1 1 1 1]. Hence, a bit error is only introduced in the $3^{rd}$ page of the 15 transformed pages.

Accordingly, as a result of the memory matching transform, the bit error rate introduced to each page of the transformed pages 320 corresponds to the cell error rate associated with the corresponding read threshold. Additionally, an appropriate protection level may be assigned to each transformed page corresponding to the expected CER of the corresponding read threshold. Different memory matching transforms may also be used in place of the transform shown by FIGS. 3A-3B. For example, a page level matching transform may be used.

The overall bit error rate (BER) of the original n=4 pages (i.e., the Lower page 302, the Middle page 304, the Upper page 306, and the Top page 308) and the overall BER of the transformed pages 320 is the same. Specifically:

$$BER_{Lower}+BER_{Middle}+BER_{Upper}+BER_{Top}=BER_{t1}+BER_{t2}+\ldots+BER_{t15}$$

On average the BER observed by each transformed page 320 is $n/t=4/15$ that of an original page. Accordingly, the overall ECC redundancy required for protecting the transformed pages 320 is the same as the ECC redundancy required for protecting the n=4 original data pages.

The transformed pages 320 are encoded using an LDPC encoder (i.e., a memory matched LDPC encoder, a $m^2$LDPC encoder) which accounts for the error rates of the transformed pages 320. An amount of parity bits is assigned to each of the transformed pages 320 according to their expected BER. Accordingly, parity bits may be symmetrically assigned should each transformed page 320 have the same expected BER. In some examples, when the transformed pages 320 have varying BERs, the parity bits may be asymmetrically assigned. In other examples, a single LDPC code may be used, where within the underlying bipartite graph representing the LDPC code, a different degree spectrum (i.e., a different allocation of parity check equations per bit) is used for each of the transformed pages 320. The degree spectrum then corresponds to the respective transformed page's expected BER. For example, a subset of bits expected to exhibit a higher BER, such as those influenced by a more error prone read threshold, participate in more parity check equations than a subset of bits expected to exhibit a lower comparative BER.

Figure 4:
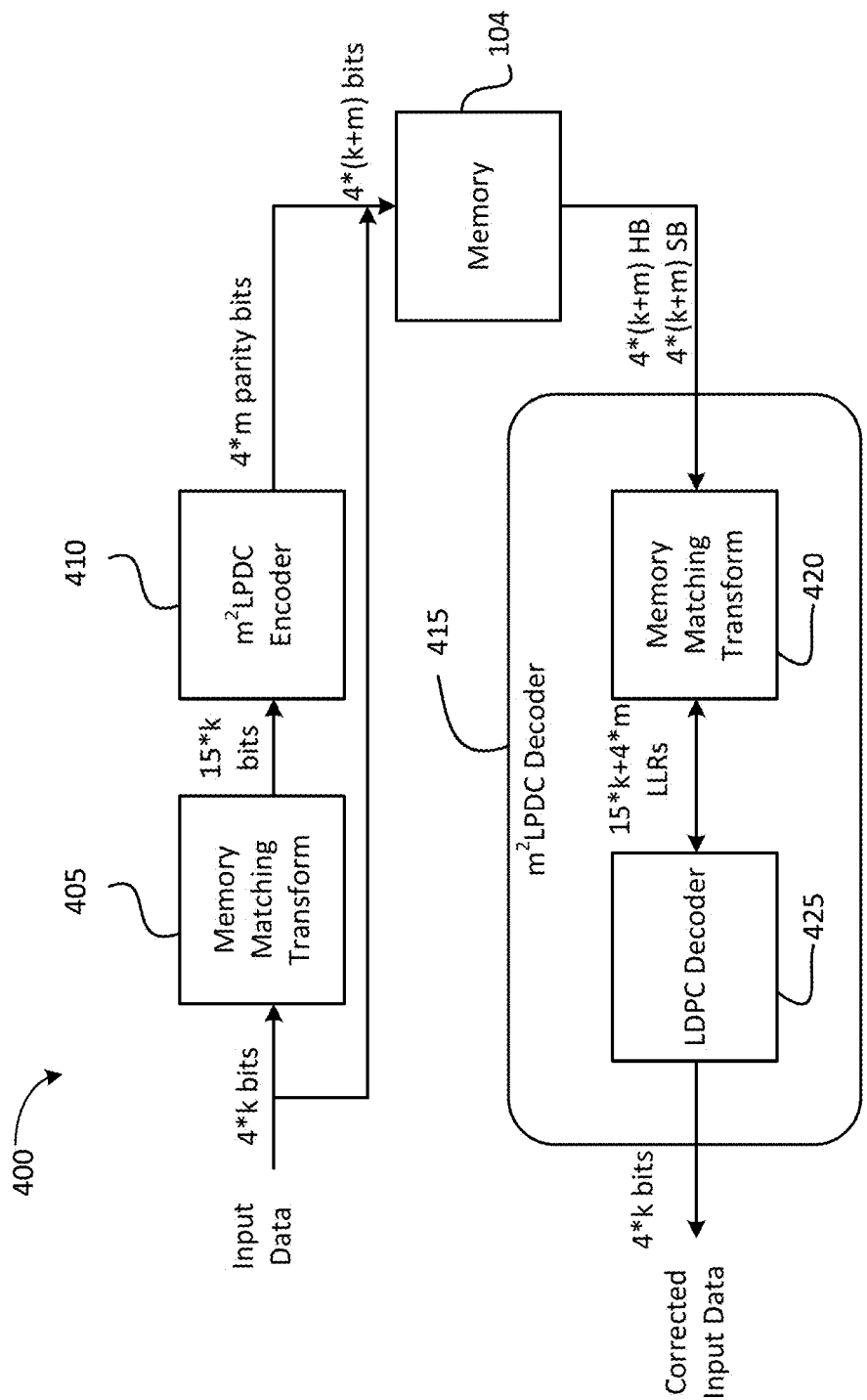
FIG. 4 is a flowchart illustrating a memory matched LDPC encoding/decoding process, in accordance with some embodiments of the disclosure.

FIG. 4 illustrates an example process 400 for the memory matched LDPC encoding and decoding method. The process 400 may be performed by the ECC engine 122. In the example of FIG. 4, n=4 user data pages (i.e., the Lower page 302, the Middle page 304, the Upper page 306, and the Top page 308) are provided as input data, each page comprising k bits. The input data of 4*k bits are provided to memory matching transform encoding block 405. The memory matching transform block encoding 405 transforms the input data to t=15 transformed pages (e.g., the transformed pages 320) of k bits. The transformed 15*k bits are encoded by a memory matched LDPC encoder 410, which produces n*m=4*m parity bits. In parallel to the memory matching transform encoding block 405 and the memory matched LDPC encoder 410, the 4*k original user bits are stored in the memory 104 (i.e., the QLC data pages) with the 4*m parity bits, such that there are k+m bits per page.

The transformed pages are not stored directly in the memory 104, as a memory cell can store only n pages, and cannot directly store $t=2^n-1$ pages. Rather, during a read operation, the transformed pages are inferred from the read cell voltages (Vt) via an inverse memory matching transform. For example, the cell's state, the values of the logical pages (e.g., Lower page 302, Middle page 304, Upper page 306, and Top page 308), and the values of the transformed pages 320 can be inferred from the read cell's Vt. The read operation retrieves a quantized version of the cells' Vt (denoted in FIG. 5 as Y), at any required resolution. In one embodiment, a read is performed at the nominal read thresholds shown in FIG. 2 to retrieve the Hard Bit (HB) pages and infer the cells' states. In another embodiment, a higher read resolution (determining the cell's Vt more finely) to retrieve Soft Bits (SB) in addition to the Hard Bits is used for assigning reliabilities to the read values.

Figure 8:
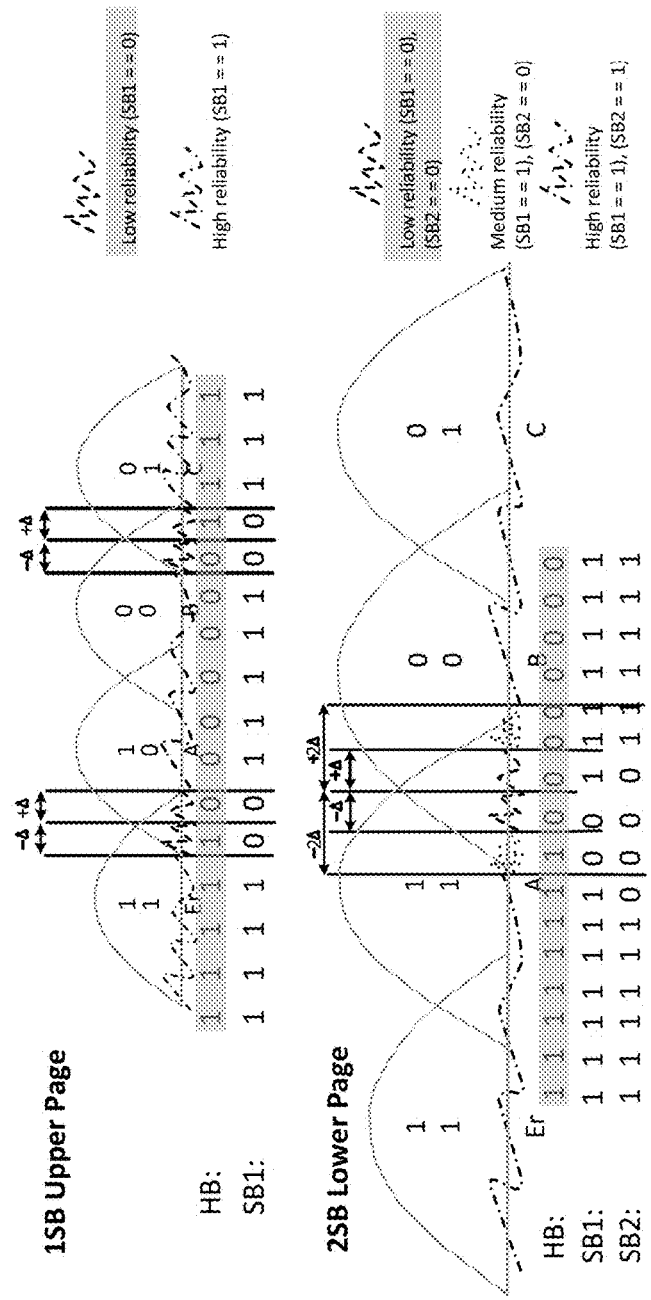
FIG. 8 provides example soft-bit reads, in accordance with some embodiments of the disclosure.

Each Hard Bit corresponds to the logical pages (e.g., Lower page 302, Middle page 304, Upper page 306, and Top page 308) read from the memory 104. Each Soft Bit indicates how close the cell's Vt is to a read threshold, as illustrated in FIG. 8. Accordingly, the Soft Bit indicates how likely the Hard Bit is incorrect (e.g., the likelihood of a read error). The combination of the cell's read Hard Bits and Soft Bits is denoted as Y and corresponds to a quantized version of the cell's Vt. The read cell value Y can be used to determine the probability that the cell was programmed to different states s=0, 1, . . . , $2^n-1$. The probability that a certain value Y was read from a cell that was programmed to state s, denoted as Pr(Y|s), may be computed based on the CVD model.

Figure 5:
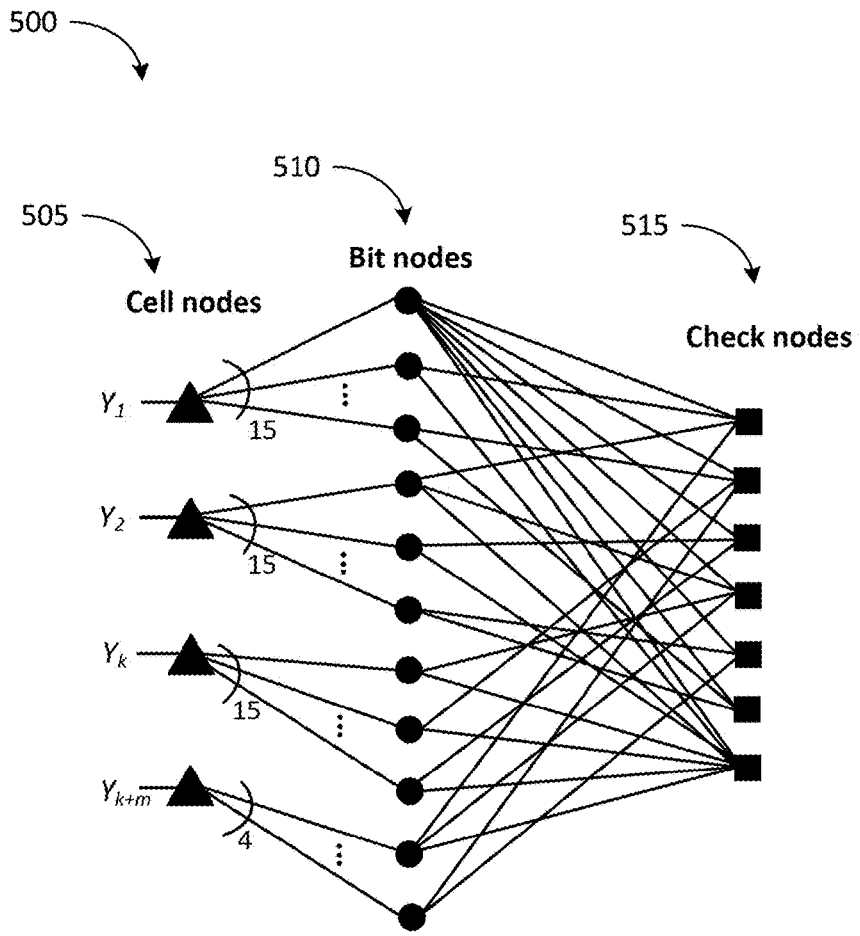
FIG. 5 is an example memory matched LDPC message passing process, in accordance with some embodiments of the disclosure.

During a read operation, decoding is performed on the read cell values Y in m²LDPC decoder 415, in order to correct the errors introduced by memory 104 and recover the user data that was stored in the memory 104. The m²LDPC decoding operation applies a unique iterative message passing decoding algorithm. The m²LDPC message passing algorithm can be viewed as operating over a tri-partite graph (as opposed to conventional LDPC message passing decoding which operates over a bi-partite graph), having "cell nodes," "bit nodes," and "check nodes," with appropriate message computation rules. The messages exchanged over the edges of the tri-partite graph convey estimations on the codeword bits, which improve iteratively. A common metric used for conveying the bit estimations is Log-Likelihood-Ratio (LLR). The LLR for a bit b, given observation V, is defined according to Equation (1):

$$LLR_b(V) = \log \frac{Pr(b = 0|V)}{Pr(b = 1|V)} \quad (1)$$

where log base 2 is assumed for calculations described herein, but bases of other values may be used. An example tri-partite graph 500 is illustrated in FIG. 5. The tri-partite graph 500 includes cell nodes 505, bit nodes 510, and check nodes 515.

The cell nodes 505 comprise of k information cells ("storing" the original n*k=4*k information bits) and m parity cells ("storing" the n*m=4*m parity bits). Each cell node 505 is connected to t=15 bit nodes, corresponding to the t=15 transformed information bits that which the cell indirectly stores. Each parity cell node is connected to n=4 bit nodes, corresponding to the n=4 parity bits that the cell directly stores. The operation performed between the information cell nodes 505 and their corresponding bit nodes 510 is an "inflation" operation, "inflating" from the n=4 read bits to the t=15 transformed bits. The inflation operation corresponds to the memory matching transform at the log likelihood ratio (LLR) level. The memory matching transform performed between the cell nodes 505 and the bit nodes 510 computes LLR estimations for the transformed bits, denoted as T messages. The LLR message from information cell node f to bit node v is computed according to the following Expression (2a):

$$T_{fv} = \log \frac{\sum_{s=i}^{15} 2^{\sum_{j=1, j \neq i}^{s} Q_{v_j f}} \cdot P(Y|s)}{\sum_{s=0}^{i-1} 2^{\sum_{j=1}^{s} Q_{v_j f}} \cdot P(Y|s)} \quad (2a)$$

The LLR message from parity cell node f to bit node v is computed according to the following Expression (2b):

$$T_{fv} = \log \frac{\sum_{s \text{ s.t. } s(v)=0} 2^{\sum_{j=1, v_j \neq v}^{n} (1-s(v_j)) Q_{v_j f}} \cdot P(Y|s)}{\sum_{s \text{ s.t. } s(v)=1} 2^{\sum_{j=1, v_j \neq v}^{n} (1-s(v_j)) Q_{v_j f}} \cdot P(Y|s)} \quad (2b)$$

where s(v) is the value of bit v in state s.

The LLR message from bit node v to cell node f is computed according to Expression (3):

$$Q_{vf} = \sum_{c' \in N(v)} R_{c'v} \quad (3)$$

A conventional LDPC message passing decoding is performed between the bit nodes 510 and the check nodes 515 by exchanging bit-to-check messages (denoted as Q messages) and check-to-bit messages (denoted as R messages). The check nodes impose parity check constraints on the bit nodes connected to them (as guaranteed by the encoding operation, which generated the parity bits, such that the parity check constraints were met). The LLR message from bit node v to check node c (conveying the current bit estimation) is computed according to Expression (4):

$$Q_{vc} = T_{fv} + \sum_{c' \in N(v) \dagger c} R_{c'v} \quad (4)$$

The LLR message from check node c to bit node v (conveying an updated bit estimation based on the fact that the bits connected to the check nodes should satisfy a parity check constraint) is computed according to Expression (5):

$$R_{cv} = \varphi^{-1}(\sum_{v' \in N(c) \dagger v} \varphi(Q_{v'c})) \quad (5)$$

where $\varphi(x) = \varphi^{-1}(x) = (\text{sign}(x), -\log_2(\tan h(x/2)))$.

In the example of FIG. 5, each check node 515 is connected to four bit nodes 510. In other examples, each check node is connected to more or less than four bit nodes 510. The four bit nodes 510 that connect to a given check node 515 add to 0 (modulo 2). If there is an error, the check node 515 instead adds to 1 (modulo 2). The error can then be detected and corrected when the check node 515 adds to 1. In some examples, the memory matching transforms are also be based on the current bit estimation, conveyed by the Q messages.

Returning to FIG. 4, 4*(k+m) "hard bits" and 4*(k+m) "soft bits" are input into the memory matched LDPC decoder 415. A "soft" memory matching transform decoding block 420 decodes the provided hard bits and soft bits (indicating a quantized read cell's Vt value Y) and outputs the 15*k transformed pages and the 4*m parity bits in LLR form (hence this is a "soft" transform, conveying soft estimations of the transformed information bits and parity bits). The soft memory matching transform corresponds to the iterative message passing operation performed between the cell nodes and the bit nodes. A LDPC decoder block 425 updates the LLR estimations of the bits by utilizing the fact that the 15*k transformed bits and the 4*m parity bits should satisfy a set of parity check constraints. This corresponds to the message passing operation performed between the bit nodes and the check nodes. Several iterations may be performed between the memory matching transform block 420 and the LDPC decoder block 425, until the bit estimations of the 15*k transformed bits and the 4*m parity bits satisfy all the parity check constraints, indicating that the decoding operation converged to a valid codeword. Once the decoding operation has converged to a valid codeword (indicating that the decoder 425 corrected all the errors within the 15*k transformed pages), the decoder 425 retrieves the original 4*k bits from the 15*k transformed pages (by applying the inverse hard memory matching transform) to output the corrected input data.

Figure 6:
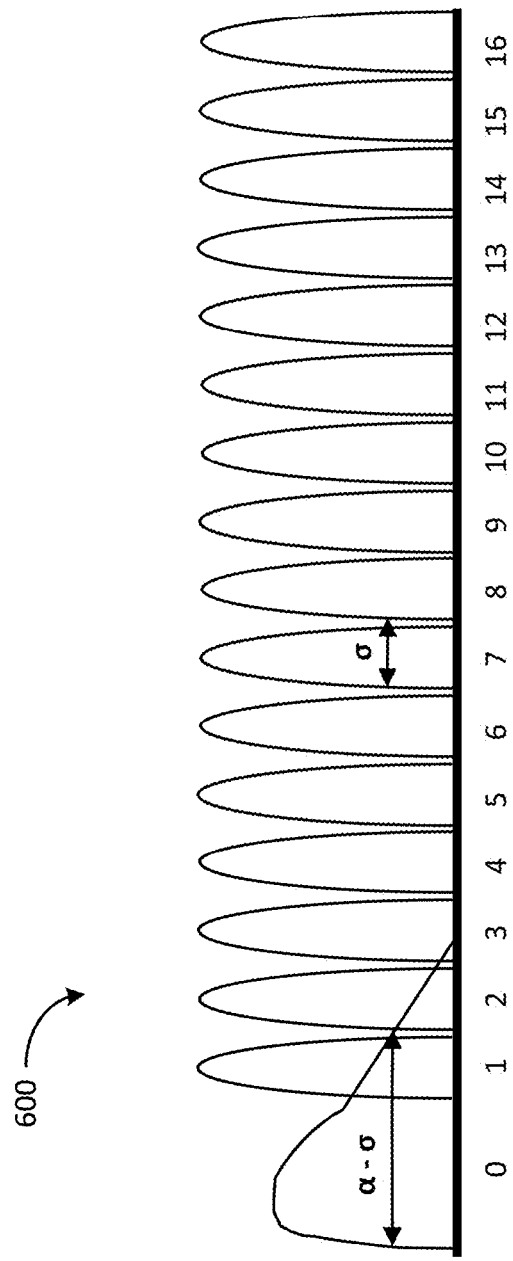
FIG. 6 is a graph illustrating a QLC memory with Gaussian memory level distributions, in accordance with some embodiments of the disclosure.
Figure 7:
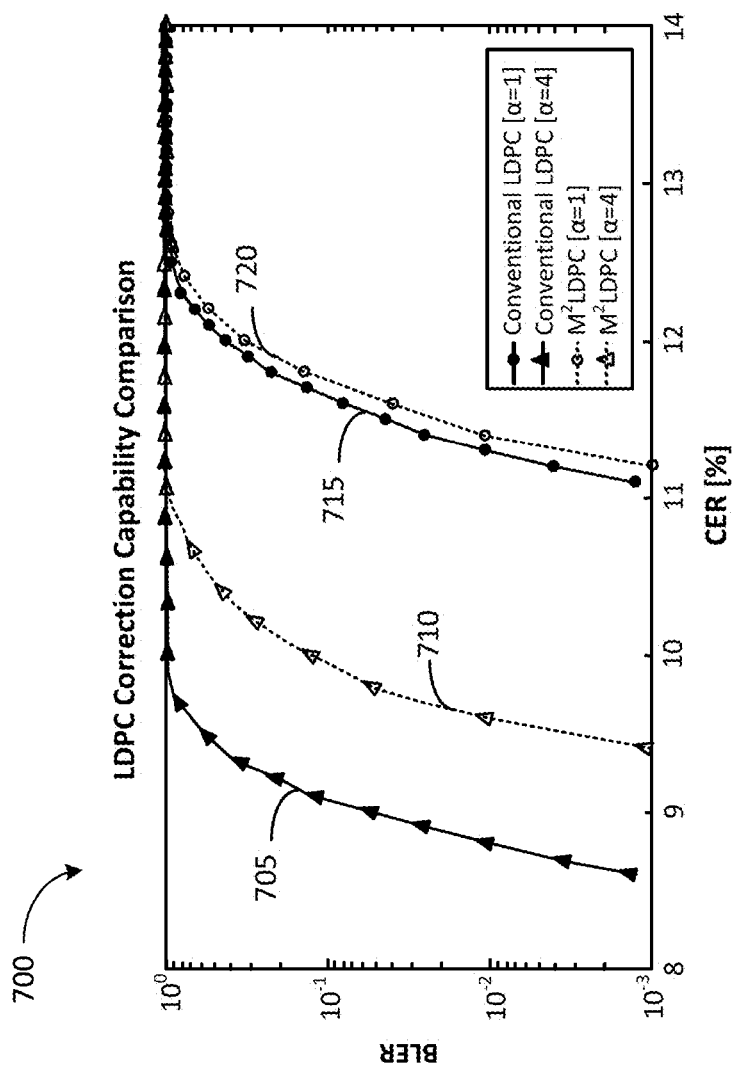
FIG. 7 is a graph illustrating decoder failure probability as a function of cell error rate, in accordance with some embodiments of the disclosure.

FIG. 6 illustrates a QLC memory with a plurality of memory cell states 600. The plurality of memory cell states 600 have a Gaussian distribution, where the standard deviation ($\sigma$) of the state 0 (i.e., the Er state) is some value $\alpha$ times greater than that of the other states. The LDPC correction capability of the QLC memory of FIG. 6 is illustrated in FIG. 7 for various $\alpha$ values. FIG. 7 provides a graph 700 illustrating the decoder failure probability as a function of the CER. First curve 705 and third curve 715 correspond to a conventional LDPC coding method. Second curve 710 and fourth curve 720 correspond to the memory matched LDPC coding (also referred to as "m²LDPC") described herein. Additionally, first curve 705 and second curve 710 correspond to α=4, while the third curve 715 and fourth curve 720 correspond to α=1. As α increases and the memory model becomes more asymmetric (i.e., increased variance between the error rates of different read thresholds), the effectiveness of the memory matched LDPC coding increases.

In addition to the benefit of improved correction capability, the use of the proposed memory matched LDPC coding has several additional benefits. When using m²LDPC codes, the errors introduced by each read threshold affect a unique subset of bits (i.e. a specific transformed page associated with that read threshold). By estimating the Bit Error Rate (BER) of each transformed page, the error rate associated to each read threshold may be estimated. The error rate of a transformed page may be estimated by comparing the initial read bit values of the transformed page to the corrected transformed page bit values post decoding, assuming the decoder has converged. Alternatively, the number of unsatisfied parity check equations associated with the initial read bits of the transformed page can be used for BER estimation. The higher the number of unsatisfied parity check constraints (aka Syndrome Weight), the higher the expected BER. This approach may be applied even if decoding fails (as its based solely on the initial read bit values). Estimating the BER of each of the read thresholds can be used for estimating the underlying memory error model or CVD associated with the read memory Word Line of memory 104. This in turn can be used for accessing the memory health. It may also be used for computing accurate LLR values for the decoder based on more accurate estimation of P(Y|s).

Another application of the ability to estimate the BER per read threshold is for adjusting and tuning the read thresholds. An optimal read threshold may be found as the read threshold which minimizes its associated BER estimation. A directional BER, indicating how many bits have flipped from 0 to 1 ($BER_{0\to 1}$) and how many bits have flipped from 1 to 0 ($BER_{0\to 1}$) may also be estimated per read threshold by comparing the initial transformed page bit values before decoding to their values after decoding. The directional BER may provide an indication to which direction the read threshold needs to be adjusted for minimizing the BER and for balancing $BER_{0\to 1}$ and $BER_{0\to 1}$.

The embodiments described so far are based on LDPC coding with iterative message passing decoding. However, the memory matched coding concept may be applied to other coding schemes as well. A memory matching transform may be applied to the user data and then any given coding scheme (BCH, RS, or other suitable coding scheme) may be applied to each of the transformed pages. During read, an inverse memory matching transform may be applied. The inverse memory matching transform may be a hard transform (on the read bits) or a soft transform (outputting LLRs for a soft decoder). After the inverse memory matching transform decoding may be applied to correct the errors across the transformed pages.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A memory controller, comprising:
   a memory interface configured to interface with a non-volatile memory; and
   a controller configured to: receive a plurality of data pages associated with a write command, the plurality of data pages to be stored in the non-volatile memory, wherein the plurality of data pages is N data pages,
   transform the plurality of data pages associated with the write command into a plurality of transformed data pages, wherein the plurality of transformed data pages is $2^N-1$ data pages,
   determine a plurality of parity bits based on the plurality of transformed data pages, and
   store the plurality of data pages and the plurality of parity bits in the non-volatile memory.

2. The memory controller of claim 1, wherein each of the plurality of transformed data pages is affected by errors of an associated read threshold of the non-volatile memory.

3. The memory controller of claim 1, wherein a bit error rate of the plurality of data pages is equal to a bit error rate of the plurality of transformed data pages.

4. The memory controller of claim 1, wherein the non-volatile memory includes a plurality of memory cell states, and wherein a number of the plurality of transformed data pages is based on a number of read thresholds of the plurality of memory cell states.

5. The memory controller of claim 1, wherein the controller is further configured to:
retrieve the stored plurality of data pages and the stored plurality of parity bits from the non-volatile memory, the stored plurality of data pages including a plurality of data hard bits and a plurality of data soft bits, and the stored plurality of parity bits including a plurality of parity hard bits and a plurality of parity soft bits.

6. The memory controller of claim 5, wherein the controller is further configured to:
transform the stored plurality of data pages into a second plurality of transformed data pages, and
determine log likelihood ratio estimations for the second plurality of transformed data pages and the plurality of party bits.

7. The memory controller of claim 6, wherein the controller is further configured to:
generate a corrected plurality of data pages based on the log likelihood ratio estimations for the second plurality of transformed data pages and the log likelihood ratio estimations for the plurality of parity bits.

8. The memory controller of claim 5, wherein the controller is further configured to:
transform the stored plurality of data pages into a second plurality of transformed data pages,
determine whether the second plurality of transformed data pages and the plurality of parity bits satisfy a set of parity check constraints, and
adjust, in response to the second plurality of transformed data pages and the plurality of parity bits failing to satisfy the set of parity check constraints, a value of at least one of the second plurality of transformed data pages.

9. The memory controller of claim 8, wherein the controller is further configured to:
determine whether the second plurality of transformed data pages and the plurality of parity bits satisfy the set of parity check constraints, and
adjust the value of at least one of the second plurality of transformed data pages until the second plurality of transformed data pages and the plurality of parity bits satisfy the set of parity check constraints.

10. The memory controller of claim 1, wherein a bit error distribution induced by the non-volatile memory over the plurality of transformed data pages is different than an error distribution over the plurality of data pages.

11. The memory controller of claim 1, wherein the controller is further configured to:
determine a memory error model of the non-volatile memory based on an estimated bit error rate of the plurality of transformed data pages, and
determine a health of the non-volatile memory based on the memory error model.

12. The memory controller of claim 1, wherein the controller is further configured to:
adjust read thresholds of the non-volatile memory based on an estimated bit error rate of the plurality of transformed data pages.

13. A method comprising:
receiving a plurality of data pages associated with a write command, the plurality of data pages to be stored in a non-volatile memory, wherein the plurality of data pages is N data pages,
transforming the plurality of data pages associated with the write command into a plurality of transformed data pages, wherein the plurality of transformed data pages is $2^N-1$ data pages,
determining a plurality of parity bits based on the plurality of transformed data pages, and
storing the plurality of data pages and the plurality of parity bits in the non-volatile memory.

14. The method of claim 13, wherein N is four.

15. The method of claim 13, wherein a bit error rate of the plurality of data pages is equal to a bit error rate of the plurality of transformed data pages.

16. The method of claim 13, wherein the non-volatile memory includes a plurality of memory cell states, and wherein a number of the plurality of transformed data pages is based on a number of the plurality of memory cell states.

17. The method of claim 13, further comprising:
retrieving the stored plurality of data pages and the stored plurality of parity bits from the non-volatile memory, the stored plurality of data pages including a plurality of data hard bits and a plurality of data soft bits, and the stored plurality of parity bits including a plurality of parity hard bits and a plurality of parity soft bits.

18. The method of claim 17, further comprising:
transforming the stored plurality of data pages into a second plurality of transformed data pages, and
determining log likelihood ratio estimations for the second plurality of transformed data pages and the plurality of party bits.

19. The method of claim 18, further comprising:
generating a corrected plurality of data pages based on the log likelihood ratio estimations for the second plurality of transformed data pages and the log likelihood ratio estimations for the plurality of parity bits.

20. An apparatus comprising:
means for interfacing with a non-volatile memory;
means for receiving a plurality of data pages associated with a write command, the plurality of data pages to be stored in the non-volatile memory, wherein the plurality of data pages is N data pages,
means for transforming the plurality of data pages associated with the write command into a plurality of transformed data pages, wherein the transformed data pages is $2^N-1$ data pages,
means for determining a plurality of parity bits based on the plurality of transformed data pages, and
means for storing the plurality of data pages and the plurality of parity bits in the non-volatile memory.

* * * * *